(12) United States Patent
Kraus et al.

(10) Patent No.: US 6,365,519 B2
(45) Date of Patent: Apr. 2, 2002

(54) BATCH PROCESSING FOR SEMICONDUCTOR WAFERS TO FORM ALUMINUM NITRIDE AND TITANIUM ALUMINUM NITRIDE

(75) Inventors: Brenda D. Kraus, Meridian; John T. Moore; Scott J. DeBoer, both of Boise, all of ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/836,123

(22) Filed: Apr. 16, 2001

Related U.S. Application Data

(62) Division of application No. 09/191,294, filed on Nov. 13, 1998, now Pat. No. 6,218,293.

(51) Int. Cl.$^7$ ............................................... H01L 21/44
(52) U.S. Cl. .................... 438/688; 438/660; 438/680; 427/255.391
(58) Field of Search ..................... 148/206; 257/915; 427/255.391, 255.394; 438/660, 680, 688

(56) References Cited

U.S. PATENT DOCUMENTS

| | | | | |
|---|---|---|---|---|
| 4,656,101 A | * | 4/1987 | Yamazaki | 428/620 |
| 5,356,608 A | * | 10/1994 | Gebhardt | 423/412 |
| 5,605,858 A | | 2/1997 | Nihioka et al. | 437/60 |
| 5,648,699 A | | 7/1997 | Jin et al. | 313/309 |
| 5,687,112 A | | 11/1997 | Ovshinsky | 365/163 |
| 5,767,578 A | | 6/1998 | Chang et al. | 257/717 |
| 5,773,882 A | | 6/1998 | Iwasaki | 257/692 |
| 5,783,483 A | | 7/1998 | Gardner | 438/627 |
| 5,783,716 A | | 7/1998 | Baum et al. | 556/136 |
| 5,786,259 A | | 7/1998 | Kang | 438/396 |
| 5,786,635 A | | 7/1998 | Alcoe et al. | 257/718 |
| 5,874,131 A | * | 2/1999 | Yaarstra et al. | 427/250 |
| 6,120,842 A | * | 9/2000 | Lu et al. | 427/250 |
| 6,130,118 A | * | 10/2000 | Yamazaki | 438/151 |
| 6,180,446 B1 | * | 1/2001 | Crenshaw et al. | 438/240 |
| 6,211,035 B1 | * | 4/2001 | Moise et al. | 438/396 |
| 6,218,293 B1 | * | 4/2001 | Kraus et al. | 438/644 |

OTHER PUBLICATIONS

Wolf et al., Silicon Processing for the VLSI Era—vol. 1: Process Technology, (Lattice Press, CA, 1986), pp. 166–174, 230.*

Wojak et al., Field emission from aluminum nitride and cubic boron nitride coatings, 9th Annual Vacuum Microelectronics Conference, Jul. 1996, p. 217–220.*

Meng et al., Rate–limiting process and growth kinetics of AlN thin films by microwave plasma CVD with AlBr$_3$–NH$_3$–N$_2$ system, Thin Solid Films, 334 (1998) 145–150.*

"Handbook of Chemical Vapor Depostion (CVD)" Principles Technology and Applications by Hugh O. Pierson, Consultant and Sandia Nation Laboratories (retired) Albuquerque, New Mexico, Noyes Publications, Westwood, New Jersey, U.S.A. pp. 216–218.

* cited by examiner

Primary Examiner—Richard Elms
Assistant Examiner—Christian D. Wilson

(57) ABSTRACT

A process used during the formation of a semiconductor device comprises the steps of placing a plurality of semiconductor wafers each having a surface into a chamber of a batch wafer processor such as a diffusion furnace. The wafers are heated to a temperature of between about 300° C. and about 550° C. With the wafers in the chamber, at least one of ammonia and hydrazine is introduced into the chamber, then a precursor comprising trimethylethylenediamine tris(dimethylamino)titanium and/or triethylaluminum is introduced into the chamber. In the chamber, a layer comprising aluminum nitride is simultaneously formed over the surface of each wafer. The inventive process allows for the formation of aluminum nitride or titanium aluminum nitride over the surface of a plurality of wafers simultaneously. A subsequent anneal of the aluminum nitride layer or the titanium aluminum nitride layer can be performed in situ.

30 Claims, 2 Drawing Sheets

BATCH PROCESSING FOR SEMICONDUCTOR WAFERS TO FORM ALUMINUM NITRIDE AND TITANIUM ALUMINUM NITRIDE

This is a division of U.S. application Ser. No. 09/191,294, filed Nov. 13, 1998 and issued Apr. 17, 2001 as U.S. Pat. No. 6,218,293.

FIELD OF THE INVENTION

This invention relates to the field of semiconductor assembly, and more particularly to a method for forming a material comprising at least one of aluminum nitride and titanium aluminum nitride over the surface of a plurality of semiconductor wafers.

BACKGROUND OF THE INVENTION

In the manufacture of semiconductor devices various uses for aluminum nitride (AlN) and titanium aluminum nitride (TiAlN) have been proposed. AlN has been used, for example, as an insulator and as a heat sink. TiAlN has been used for an adhesion layer and as a conductive layer, and both AlN and TiAlN have been used for diffusion barriers. Aluminum nitride compounds are extremely hard substances thereby making them also useful as etch stop layers.

U.S. Pat. No. 5,783,483 describes a method of forming an aluminum nitride layer by first depositing a thin aluminum layer by sputtering, chemical vapor deposition (CVD) or ion implantation. Next, the aluminum layer is thermally cycled in a nitrogen ambient to form an aluminum nitride barrier layer. An aluminum nitride layer can further be formed in a single step using CVD or reactive sputtering. After formation of a desired layer, aluminum nitride can be patterned using $Cl_2$ or $BCl_3$ gas using reactive ion etching (RIE).

U.S. Pat. No. 5,687,112 describes that titanium aluminum nitride may be deposited by such methods as physical vapor deposition including evaporation, ion plating as well as by DC and RF sputtering deposition, chemical vapor deposition, and plasma assisted chemical vapor deposition. The exact method used depends upon many factors, for example deposition temperature constraints imposed by the composition of the target material.

Prior methods of forming TiAlN and AlN include formation of the material on a single wafer. Single wafer processing is known to be time consuming and therefore expensive, but a process to form a layer of TiAlN or AlN simultaneously over a plurality of wafers has not been feasible as prior precursor technology has not been viable with only thermal decomposition. In addition to costs added from long processing times, single wafer processing is expensive because additional equipment must be purchased to provide adequate manufacturing throughput. Further, previous methods of forming AlN or TiAlN result in layers having varying thickness over device features, for example thinning at the edges of features, which can decrease device performance and yields. A method for forming TiAlN and AlN on two or more wafers simultaneously which also can improve step coverage would increase production throughput, decrease costs, and improve device performance and yields, and would therefore be desirable.

SUMMARY OF THE INVENTION

The present invention provides a new process for forming a layer comprising one of aluminum nitride and titanium aluminum nitride over a semiconductor substrate assembly. The process decreases the time and cost of wafer manufacture and increases wafer throughput by allowing for the simultaneous processing of multiple wafers. In accordance with one embodiment of the invention, at least two wafers are placed into a diffusion furnace. With the wafers in the furnace, a precursor comprising at least one of triethylaluminum and trimethylethylenediamine tris(dimethylamino) titanium is placed into the diffusion furnace. The temperature of the wafers is increased and a layer comprising at least one of aluminum nitride and titanium aluminum nitride is simultaneously formed over a surface of each wafer.

Thus the instant process allows for the formation of a layer comprising one of a titanium aluminum nitride layer and an aluminum nitride layer over the surfaces of two or more wafers simultaneously thereby increasing throughput over conventional single wafer processing.

Other objects and advantages will become apparent to those skilled in the art from the following detailed description read in conjunction with the appended claims and the drawings attached hereto.

Figure 1:
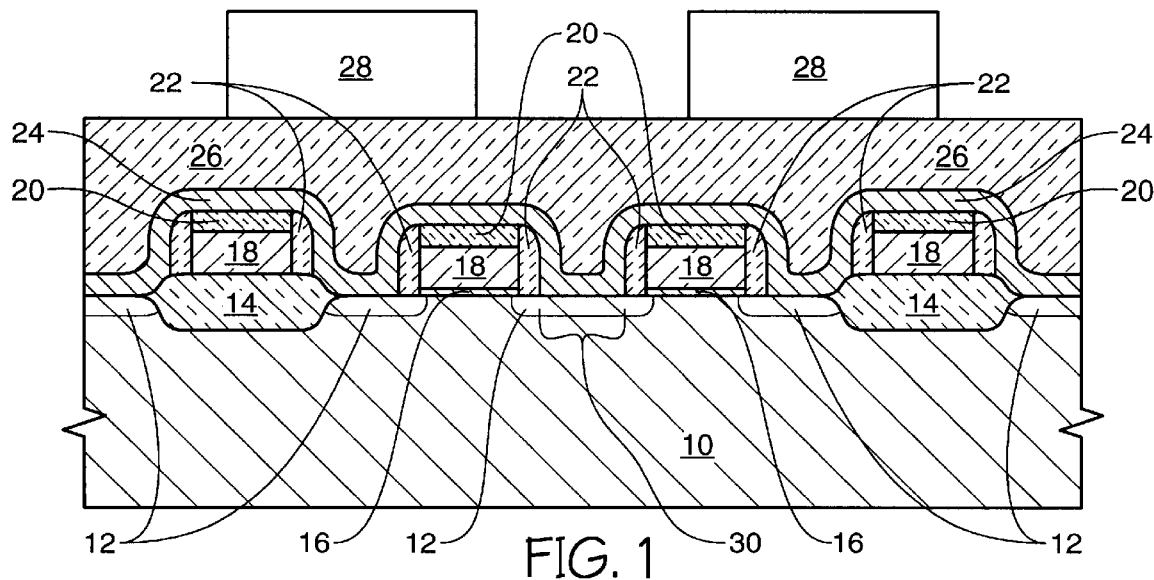
FIG. 1 is a cross section depicting a wafer substrate assembly and a capacitor bottom electrode layer which can be formed using an embodiment of the invention.

It should be emphasized that the drawings herein may not be to exact scale and are schematic representations. The drawings are not intended to portray the specific parameters, materials, particular uses, or the structural details of the invention, which can be determined by one of skill in the art by examination of the information herein.

DETAILED DESCRIPTION OF THE PREFERRED EMBODIMENT

The instant invention comprises the formation of one or more layers of either aluminum nitride (AlN), titanium aluminum nitride (TiAlN), or one or more layers of both materials over a plurality of wafers simultaneously using an inventive process. While it is appreciated that AlN is a dielectric and TiAlN is a conductor, the layers are formed using similar processes with a common precursor for each material, and an additional precursor to form TiAlN.

A first inventive embodiment to form an aluminum nitride dielectric includes placing a plurality of wafers (at least two wafers and preferably a larger number) into a diffusion furnace reactor. A furnace including a dispersion injector, such as a model A400 vertical diffusion furnace available from ASM of Phoenix, Ariz., as well as other multiple-wafer furnaces, would be sufficient.

After the wafers are placed in the furnace, a furnace purge, for example using one or both of $N_2$ and argon, can be performed to provide a controlled process atmosphere. Next, the wafers are heated to a temperature of between about 350° C. and about 550° C., and preferably in the range of about 425° C. to about 450° C. in the presence of an inert gas such as argon. Once the target temperature is reached, ammonia is bottom injected into the reactor at a gas flow rate of from about 5 standard $cm^3$/minute (sccm) to about 300 sccm to provide an ambient ammonia atmosphere for each wafer. It should be noted that it may be possible to use hydrazine for this step to provide a hydrazine atmosphere, and for other processing steps, rather than ammonia. Subsequently, a flow of an aluminum precursor such as triethylaluminum (TEAL) is initiated, for example at a flow rate of 300 sccm or less. The flow of TEAL is maintained for between about 300 seconds (5 minutes) and about 10,000 seconds (2.78 hours), and preferably for between about 500 seconds and 1500 seconds to form an aluminum nitride layer of from about 25 angstroms (Å) to about 2.0 KÅ thick. Pressure for the above steps is maintained at about one torr or less. Thicker films may be deposited by increasing the deposition time. Finally, the wafer is cooled and wafer processing is continued, or an optional in situ anneal step can be performed at temperature. This process results in an AlN dielectric layer formed simultaneously over the surfaces of a plurality of wafers, thereby decreasing processing time over a single-wafer process.

To form a layer of titanium aluminum nitride, a similar process is used. The reactor parameters remain the same as those used for the formation of aluminum nitride, but the chemistry is altered. To form TiAlN, both ammonia and hydrogen are bottom injected into the reactor at a gas flow rate of about 500 sccm or less. Further, both TEAL and an a titanium precursor such as trimethylethylenediamine tris (dimethylamino)titanium (TMEDT) are bottom injected at temperature in the presence of ammonia as described for AlN formation. Gas flow rates of 500 sccm or less for both the TEAL and TMEDT would be sufficient, and a duration of between about 100 seconds and about 10,000 seconds, and preferably for between about 500 second and 1500 seconds would form a titanium aluminum nitride layer from about 25Å to about 2KÅA thick. For TiAlN formation, a pressure of less than one torr is maintained.

It should be noted that the above flow rates are batch size dependent. For large batches, the flow rates may need to be increased, for example up to 1,000 sccm. The flow rates required can be determined by an artisan of ordinary skill from the information contained herein. To further increase the number of wafers which can be simultaneously processed, a multiport injection of the TEAL and/or TMEDT up the length of the tube can be performed. The multiport injection, in addition to allowing for increased load size, may improve uniformity of the layer across the batch of wafers.

After the formation of the TiAlN film, an in situ anneal or conditioning step may be required in some cases, for example to densify the film to prevent the unbonded titanium from oxidizing upon exposure to air. Additionally, more than one deposition step and more than one anneal step may be used to achieve a more stable film. An anneal step, for example using $NH_3$, $N_2$, or $H_2$ at the deposition temperature or higher between 200 millitorr and 25 atmospheres, for example at one atmosphere, would cause the unbonded titanium within the film to bond with nitrogen to form a densified TiAlN film. Thus the instant process for forming TiAlN allows the formation of the material over a plurality of wafer substrates simultaneously, and also decreases processing time resulting from a subsequent in situ conditioning or anneal step in the diffusion furnace.

Figure 2:
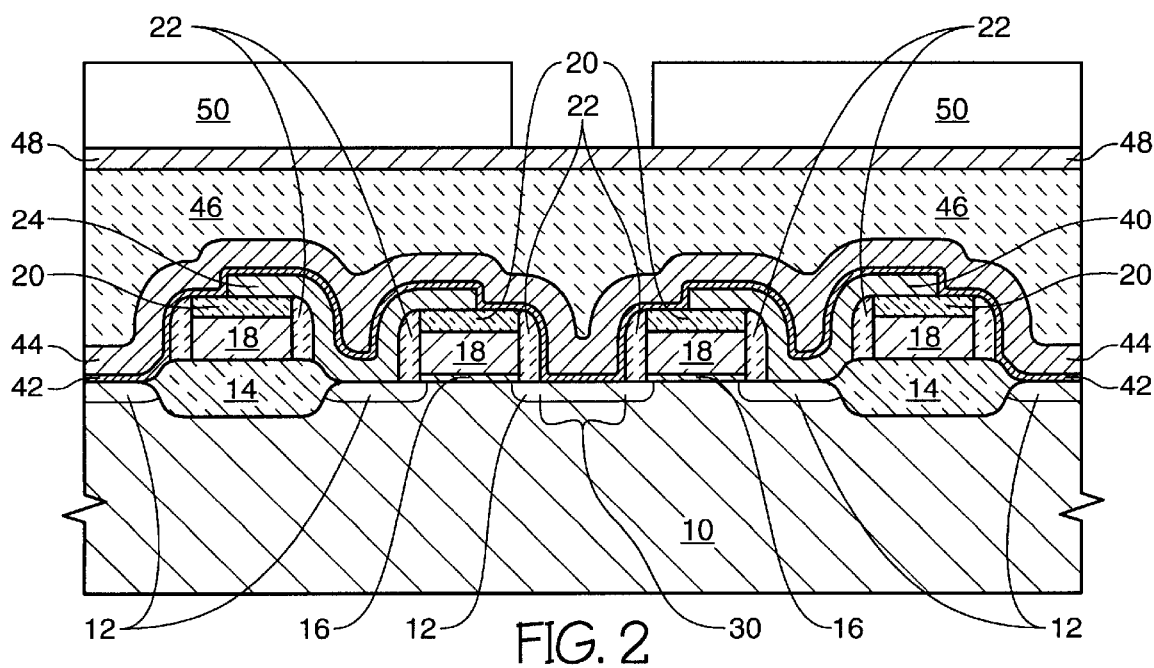
FIG. 2 is a cross section depicting the structure of FIG. 1 after forming various other layers, one or more of which can be formed using an embodiment of the inventive process.

FIGS. 1 and 2 illustrate one possible use of the inventive process to form a layer of TiAlN as a capacitor bottom electrode and another layer as a top plate, and to form a layer of AlN as a capacitor dielectric and another layer as a deposited antireflective coating (DARC) layer under a photoresist layer. This process is for purposes of illustration only, as the inventive process can be used to form either TiAlN or AlN, or both, for any particular structure for which the material is useful.

FIG. 1 depicts a semiconductor substrate assembly comprising a semiconductor wafer 10 having doped regions therein 12, field oxide 14, gate oxide 16, and a plurality of transistor gates 18 having a protective oxide cap 20 such as tetraethyl orthosilicate thereover and oxide or nitride spacers 22. This structure can be manufactured by one of ordinary skill in the art.

Next, a plurality of wafers comprising the wafer substrate assembly described above are placed into a diffusion furnace. The wafers are heated to a temperature of from between about 350° C. to about 550° C., for example to about 425° C. in an argon, hydrogen, or nitrogen atmosphere. Once the wafers reach 425° C. ammonia and hydrogen are bottom injected into the reactor at a gas flow rate of 500 sccm or less, for example 290 sccm for each gas to provide an ammonia atmosphere. Subsequently, a flow of TEAL and TMEDT are bottom injected into the reactor at 290 sccm for each gas. Using these parameters, it is expected that TiAlN will form on the wafer substrate assembly surface such as that depicted in FIG. 1 at a rate of about 10 Å/minute, and thus for a target of about 500 Å this process is continued for 50 minutes to form the TiAiN layer 24 as depicted in FIG. 1.

Next, a planar layer such as a borophosphosilicate glass (BPSG) layer 26 and a patterned photoresist layer 28 are conventionally formed over each wafer as depicted in FIG. 1 which requires removal of the wafers from the furnace. The exposed BPSG and TiAlN materials are then removed to expose the wafers at the locations uncovered by resist. This etch exposes the wafer at various doped regions, for example at region 30 where a digit line contact will be formed. The etch further defines the storage capacitor bottom electrode (40 in FIG. 2). The resist and BPSG are stripped using conventional processing subsequent to forming the FIG. 1 structure.

Next, the wafers are placed back into the furnace to form the capacitor cell dielectric and the top plate. A cell dielectric may be formed from AlN using an inventive process, for example by heating the wafers to a temperature of from between about 350° C. to about 550° C., for example to about 425° C. in an argon atmosphere. Once the wafers reach 425° C., ammonia is bottom injected into the reactor at a gas flow rate of 300 sccm or less, for example at 290 sccm, to provide an ammonia atmosphere. Subsequently, a flow of TEAL is bottom injected into the reactor at 290 sccm. Using these parameters, it is expected that AlN will form on a wafer substrate assembly surface such as that depicted in FIG. 2 at a rate of about 240Å/minute (about 4Å/sec), and thus for a target of from about 50Å to about 250Å this process is continued for between about 12 seconds to about one minute to form the AlN layer 42 as depicted in FIG. 2.

Subsequently, another layer of TiAlN 44 can be formed conformally with the cell dielectric 42 to form the capacitor top plate. The process described above using TEAL and TMEDT as precursors can be modified to form a desired layer of from about 300 Å to about 500 Å thick. The wafers are then removed from the furnace and a planar layer of BPSG 46 is formed according to means known in the art. FIG. 2 further depicts an AlN antireflective layer 48 formed over the BPSG layer using a process described above to form AlN. Using the parameters described above for forming a cell dielectric layer, it is expected that an antireflective AlN layer will form over BPSG at a rate of about 240Å/minute (4Å/sec). The thickness of the AlN antireflective layer will depend on the qualities of the material, and a layer of from about 100Å to about 500Å, for example 300Å thick should be sufficient. Subsequent to forming the antireflective layer 48 a patterned resist layer 50 is formed. The material overlying the wafer is etched to expose the wafer at the digit line contact area 30. Wafer processing continues to form a semiconductor device.

Figure 3:
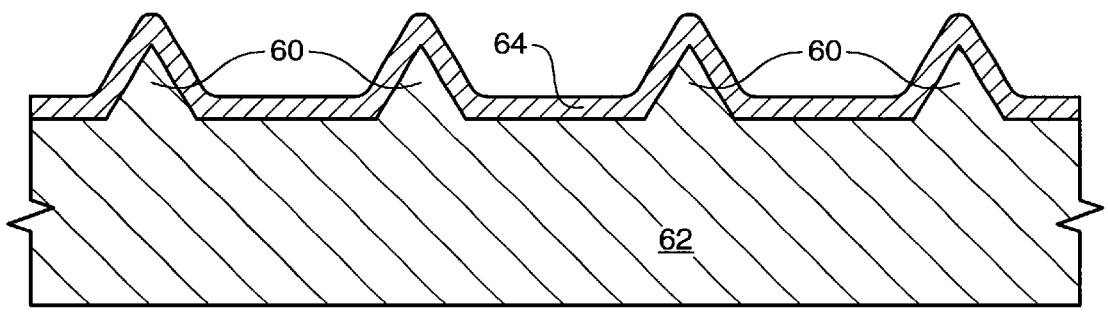
FIG. 3 is a cross section depicting the use of an aluminum nitride layer as a dielectric to protect and to improve the electrical characteristics of a field emitter display tip.

Another possible use of the invention is depicted in FIG. 3 which includes an array of emitter tips 60 such as those used in a field emitter display (FED). The tips are formed according to means known in the art on a plurality of substrate assemblies such as silicon semiconductor wafers having various layer formed therein and thereover, or other substrate assemblies, one of which is depicted as element 62. A layer of aluminum nitride dielectric 64 is formed simultaneously over the tips on the plurality of wafer substrate assemblies using equipment settings as described above. Aluminum nitride reduces the effective work function of the field emitter tips thereby reducing the required operating voltage. An aluminum nitride coating also provides stability against degradation from contaminants and oxidation. For a field emitter tip having a height of one micron, a layer of AlN about 50Å to about 500Å thick should be sufficient to provide the necessary characteristics. The thickness of the layer is dependent on the sharpness of the tip, the material from which the tip is formed, and the porosity of the tip material. In some uses of the invention it may be desirable to decrease the etch rate of the AlN and/or TiAlN material when etching surrounding materials such as oxide and nitride, for example in processes which use the AlN or TiAlN as a mask. This can be accomplished by doping the TiAlN or AlN with carbon, for example to a concentration of less than 0.1%, by providing a carbon-containing gas in the chamber during formation of the film. Suitable carbon-containing gasses include $CH_4$, $CO_2$, acetylene, and ethylene, and other similar materials. It should be noted that $CO_2$ may be inadequate for this step as it could possibly incorporate $O_2$ into the film. Further, lowering the $NH_3$ during the film deposition may incorporate sufficient carbon into the film using the organometallic precursor itself as a carbon source.

The instant invention allows the formation of an aluminum nitride layer or a titanium aluminum layer simultaneously over a plurality of wafers. The invention further allows for the conditioning or annealing of an aluminum nitride layer or a titanium aluminum nitride layer during one or more anneals over a plurality of wafers in situ which is a more cost-effective process than single-wafer processing. To increase throughput, a fast-ramp furnace can be utilized to bring the wafers to temperature at a rate of as high as 750° C./minute (for example about 700° C./minute) without excess thermal budget. Thus a rapid ramp to an anneal temperature of greater than about 800° C. then a decrease in temperature to ambient can be advantageously implemented.

While this invention has been described with reference to illustrative embodiments, this description is not meant to be construed in a limiting sense. Various modifications of the illustrative embodiments, as well as additional embodiments of the invention, will be apparent to persons skilled in the art upon reference to this description. For example, the inventive process can be used to form only one of a bottom electrode, a cell dielectric, a top plate, and an antireflective layer, or other conductive and dielectric structures can be formed using the inventive process. Further, an aluminum precursor other than TEAL and a titanium precursor other than TMEDT can be used. Generally an aluminum precursor in the form of $R_3Al$ can be used to form AlN and it should be recognized that the aluminum precursor is not restricted to the use of the recommended $R_3Al$ precursor TEAL. A titanium precursor such as tetrakisdimethylaminotitanium (TDMAT) or tetrakisdiethylaminotitanium (TDEAT) may function adequately. It is therefore contemplated that the appended claims will cover any such modifications or embodiments as fall within the scope of the invention.

What is claimed is:

1. A process for forming a field emitter device comprising the following steps:

forming an array of emitter tips on each of a plurality of semiconductor wafers;

placing said plurality of wafers into a diffusion furnace;

increasing a temperature of said plurality of wafers in said diffusion furnace;

with said wafers in said furnace, introducing an aluminum nitride precursor into said diffusion furnace; and in said furnace, forming a layer comprising aluminum nitride from said aluminum nitride precursor over each said array of each said wafer.

2. The process of claim 1 wherein said formation of said layer from said aluminum nitride precursor comprises forming a film consisting essentially of aluminum nitride.

3. The process of claim 2 wherein said introduction of said precursor comprises introducing a compound having the form $R_3Al$.

4. The process of claim 3 wherein said introduction of said precursor comprises introducing a material comprising triethylaluminum.

5. The process of claim 1 further comprising the step of introducing at least one of ammonia and hydrazine into said furnace subsequent to said step of placing said at least two wafers in said furnace and prior to said step of introducing said precursor into said furnace.

6. The process of claim 1 wherein said step of increasing said temperature of said wafers in said diffusion furnace increases said temperature to between about 300° C. and about 550° C.

7. A process used during the formation of a field emitter device, comprising:

forming an array of emitter tips on each of at least two semiconductor wafer assemblies;

placing said at least two semiconductor wafer assemblies into a diffusion furnace;

increasing a temperature of said wafer assemblies in said diffusion furnace;

with said wafer assemblies in said furnace, introducing an aluminum nitride precursor into said diffusion furnace; and in said furnace, forming a layer comprising aluminum nitride from said aluminum nitride precursor over said array of emitter tips on each of said at least two semiconductor wafer assemblies.

8. The process of claim 7 wherein said introduction of said precursor comprises introducing a compound in the form $R_3Al$.

9. The process of claim 9 wherein said introduction of said precursor comprises introducing a material comprising triethylaluminum.

10. The process of claim 9 wherein said introduction of said precursor further comprises:

introducing at least one of trimethylethylenediamine tris (dimethylamino)titanium, tetrakisdiethylaminotitanium, and tetrakisdimethylaminotitanium; and said formation of said layer comprising aluminum nitride comprises forming a titanium aluminum nitride containing film.

11. The process of claim 7 further comprising introducing at least one of ammonia and hydrazine into said furnace subsequent to said placing said at least two wafer assemblies in said furnace and prior to said introducing said precursor into said furnace.

12. The process of claim 7 wherein said increase of said temperature of said wafer assemblies in said diffusion furnace comprises increasing said temperature to between about 300° C. and about 550° C.

13. A process used during the formation of a semiconductor device comprising: providing a plurality of semiconductor wafer assemblies, each semiconductor wafer assembly of said plurality comprising an array of emitter tips;

placing said plurality of semiconductor wafer assemblies into a chamber;

heating said wafer assemblies to a temperature of between about 300° C. and about 550° C.;

with said wafer assemblies in said chamber, introducing at least one of ammonia and hydrazine into said chamber;

with said wafer assemblies in said chamber, introducing an aluminum nitride precursor into said chamber; and in said chamber, simultaneously forming a layer comprising aluminum nitride over said array of emitter tips on each of said plurality of semiconductor wafer assemblies.

14. The process of claim 13 wherein said introduction of said precursor comprises introducing a compound in the form $R_3Al$.

15. The process of claim 14 wherein said introduction of said precursor introduces a compound comprising triethylaluminum.

16. The process of claim 15 further comprising:

said introduction of said precursor further comprises introducing at least one of trimethylethylenediamine tris(dimethylamino)titanium, tetrakisdiethylaminotitanium, and tetrakisdimethylaminotitanium; and said formation of said layer comprising aluminum nitride comprises forming titanium aluminum nitride over said array of emitter tips on each of said plurality of semiconductor wafer assemblies.

17. A process used to form an electronic device having an array of emitter tips, said process comprising:

providing at least two semiconductor wafer assemblies, each assembly comprising a semiconductor wafer and an array of emitter tips;

placing said at least two wafer assemblies into a diffusion furnace;

increasing a temperature of said wafer assemblies in said diffusion furnace to a deposition temperature;

with said wafer assemblies in said furnace, introducing an aluminum nitride precursor into said diffusion furnace;

in said furnace at about said deposition temperature, forming a layer comprising aluminum nitride from said aluminum nitride precursor over said array of emitter tips of each said at least two semiconductor wafer assemblies; and subsequent to said formation of said layer comprising aluminum nitride, annealing said layer at a temperature equal to or greater than said deposition temperature in an atmosphere comprising at least one of $H_2$, $N_2$, and $NH_3$ at a pressure of between about 200 millitorr and 25 atmospheres.

18. The process of claim 17 further comprising introducing a carbon-containing gas into said diffusion furnace during said introduction of said aluminum nitride precursor into said diffusion furnace.

19. The process of claim 18 wherein said introduction of said carbon-containing gas into said diffusion furnace comprises introducing at least one of $CH_4$, $CO_2$, acetylene, and ethylene.

20. The process of claim 17 wherein said formation of said layer comprising aluminum nitride is a first deposition and forms a first layer comprising aluminum nitride layer and said annealing is a first anneal and said process further comprises:

subsequent to said first anneal, with said wafer assemblies in said furnace, introducing an aluminum nitride precursor into said diffusion furnace;

in said furnace at about said deposition temperature, forming a second layer comprising aluminum nitride from said aluminum nitride precursor over said array of emitter tips on each said wafer assembly; and subsequent to said formation of said second layer comprising aluminum nitride, annealing said first and second layers at a temperature equal to or greater than said deposition temperature in an atmosphere comprising at least one of $H_2$, $N_2$, and $NH_3$ at a pressure of between about 200 millitorr and 25 atmospheres.

21. The process of claim 20 wherein said formation of said second layer comprises forming said second layer such that it contacts said first layer.

22. The process of claim 11 further comprising purging said diffusion furnace using at least one of $N_2$ and argon prior to said introduction of said aluminum nitride precursor into said diffusion furnace.

23. The method of claim 17 wherein said anneal comprises ramping said furnace to an anneal temperature at a rate of at least 700° C./minute.

24. The process of claim 17 wherein said anneal comprises increasing said temperature to a deposition temperature of between about 300° C. and about 500° C.

25. A process used during the formation of an electronic device, said process comprising:

providing at least two semiconductor wafer assemblies, each assembly comprising an array of field emitter display emitter tips;

placing said at least two wafer assemblies into a diffusion furnace;

increasing a temperature of said wafer assemblies in said diffusion furnace;

with said wafer assemblies in said furnace, introducing a precursor comprising at least one of trimethylethylenediamine tris(dimethylamino)titanium, tetrakisdiethylaminotitanium, and tetrakisdimethylaminotitanium into said diffusion furnace; and in said furnace, forming a layer comprising titanium aluminum nitride from said precursor over each said array of each said assembly.

26. The process of claim 25 wherein said introduction of said precursor further comprises introducing triethylaluminum.

27. The process of claim 25 further comprising introducing both ammonia and hydrazine into said furnace subsequent to said placing of said at least two wafer assemblies in said furnace and prior to said introduction of said precursor into said furnace.

28. The process of claim 25 further comprising providing a carbon-containing gas in said diffusion furnace during said formation of said layer comprising titanium aluminum nitride.

29. The process of claim 28 further comprising doping said layer comprising titanium aluminum nitride with carbon to a concentration of less than 0.1% carbon during said formation of said layer comprising titanium aluminum nitride.

30. The process of claim 25 further comprising:
- with said wafer assemblies in said furnace, introducing a precursor comprising triethylaluminum into said diffusion furnace; and
- in said furnace, forming an aluminum nitride layer from said aluminum nitride precursor over each said array of each said wafer assembly.

* * * * *